US012603037B2

(12) United States Patent
Park

(10) Patent No.: US 12,603,037 B2
(45) Date of Patent: Apr. 14, 2026

(54) DISPLAY DEVICE AND METHOD OF DRIVING THE SAME

(71) Applicant: LG Display Co., Ltd., Seoul (KR)

(72) Inventor: Se Ryong Park, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 18/940,013

(22) Filed: Nov. 7, 2024

(65) Prior Publication Data

US 2025/0246119 A1 Jul. 31, 2025

(30) Foreign Application Priority Data

Jan. 31, 2024 (KR) ........................ 10-2024-0015175

(51) Int. Cl.

| | |
|---|---|
| ***G09G 3/20*** | (2006.01) |
| ***H03F 3/04*** | (2006.01) |
| *G09G 3/30* | (2006.01) |
| *G09G 3/36* | (2006.01) |

(52) U.S. Cl.

CPC ............. *G09G 3/2096* (2013.01); *H03F 3/04* (2013.01); *G09G 3/30* (2013.01); *G09G 3/3648* (2013.01); *G09G 2310/0291* (2013.01); *G09G 2370/08* (2013.01); *G09G 2370/10* (2013.01)

(58) Field of Classification Search

CPC ...... G09G 3/2096; G09G 3/30; G09G 3/3648; G09G 2310/0291; G09G 2370/08; G09G 2370/10; H03F 3/04

See application file for complete search history.

(56) References Cited

U.S. PATENT DOCUMENTS

| | | | | |
|---|---|---|---|---|
| 2008/0019159 A1* | 1/2008 | Song | .................... | G09G 3/3688 363/62 |
| 2008/0129718 A1* | 6/2008 | Nishimura | ........... | H03K 17/122 345/87 |
| 2010/0259699 A1* | 10/2010 | Yen | ................... | G02F 1/136286 257/E27.111 |
| 2022/0415279 A1* | 12/2022 | Kang | ................... | G09G 3/3614 |

FOREIGN PATENT DOCUMENTS

KR 10-2023-0051948 A 4/2023

* cited by examiner

*Primary Examiner* — Towfiq Elahi

(74) *Attorney, Agent, or Firm* — Birch, Stewart, Kolasch & Birch, LLP

(57) ABSTRACT

A display device includes a display panel including a pixels, a timing controller configured to generate output control information based on an output timing of image data to be written to the pixels, and a plurality of amplifiers configured to output a target data voltage corresponding to the image data to output channels connected to the pixels. Each of the plurality of amplifiers includes one or more transistors configured to apply a preset rising current or falling current to an output node connected to one of the channels to output the target data voltage, and a compensation capacitance adjuster configured to adjust compensation capacitance of the output node according to the output control information.

19 Claims, 10 Drawing Sheets

< Sw connection structure in period A >

DISPLAY DEVICE AND METHOD OF DRIVING THE SAME

CROSS-REFERENCE TO RELATED APPLICATION

This application claims priority to Korean Patent Application No. 10-2024-0015175, filed in the Republic of Korea on Jan. 31, 2024, the entire contents of which is hereby expressly incorporated by reference into the present application.

BACKGROUND OF THE INVENTION

Field of the Invention

The present disclosure relates to a display device and a method of driving the same.

Discussion of the Related Art

A display device can include an amplifier to generate an analog driving signal used to drive a display panel.

The amplifier secures a phase margin by including a compensation capacitor in an output circuit. As the size of the compensation capacitor increases, the phase margin increases and the output of the amplifier can be stabilized. On the other hand, when the compensation capacitor is large, charging and discharging characteristics can deteriorate, which can limit the high-speed operation of the display device.

SUMMARY OF THE DISCLOSURE

Accordingly, the present disclosure is directed to a display device and a method of driving the same that substantially obviate one or more problems due to limitations and disadvantages of the related art.

An object of the present disclosure is to provide a display device and a method of driving the same that can improve both phase margin characteristics and data charge/discharge characteristics of the display device.

Additional advantages, objects, and features of the present disclosure will be set forth in part in the description which follows and in part will become apparent to those having ordinary skill in the art upon examination of the following or can be learned from practice of the present disclosure. The objectives and other advantages of the present disclosure can be realized and attained by the structure particularly pointed out in the written description and claims hereof as well as the appended drawings.

To achieve these objects and other advantages and in accordance with the purpose of the present disclosure, as embodied and broadly described herein, a display device includes a display panel including a plurality of pixels, a timing controller configured to generate output control information based on an output timing of image data to be written to the pixels, and a plurality of amplifiers configured to output a target data voltage corresponding to the image data to output channels connected to the pixels, wherein each of the plurality of amplifiers includes one or more transistors configured to apply a preset rising current or falling current to an output node connected to one of the channels to output the target data voltage, and a compensation capacitance adjuster configured to adjust compensation capacitance of the output node according to the output control information.

According to one more aspects of the present disclosure, the compensation capacitance adjuster can adjust the compensation capacitance to decrease according to the output control information in an initial operation period in which transition of a data voltage output from the amplifier to the target data voltage level occurs.

According to one more aspects of the present disclosure, the one or more transistors can include a pull-up transistor for sourcing the rising current from a high voltage source to the output node, and a pull-down transistor for sinking the falling current from the output node to a low voltage source.

According to one more aspects of the present disclosure, the compensation capacitance adjuster can include a plurality of capacitors connected in parallel between the output node and a common node of a gate electrode of the pull-up transistor and a gate electrode of the pull-down transistor, and a switch unit including a plurality of switches connected between the common node and one end of the plurality of capacitors and configured to selectively switch the plurality of capacitors according to the output control information.

According to one more aspects of the present disclosure, the switch unit can connect only some capacitors among the plurality of capacitors to the common node in the initial operation period in which transition of the data voltage output from the output node to the target data voltage level occurs, and connect a larger number of capacitors to the common node in an operation period in which the target data voltage is output after the initial operation period.

According to one more aspects of the present disclosure, the plurality of compensation capacitors can include first to fourth compensation capacitors, each compensation capacitor including a first electrode connected to the output node and a second electrode connected to the switch unit, and the switch unit can include a first switch turned on according to the output control information to connect the common node and the first compensation capacitor, a second switch configured to connect the common node and the second compensation capacitor, a third switch configured to connect the common node and the third compensation capacitor, and a fourth switch configured to connect the fourth compensation capacitor interposed between the common node and the output node.

According to one more aspects of the present disclosure, in the switch unit, one of the first to fourth switches can be turned on in the initial operation period in which transition of the data voltage output from the output node to the target data voltage level occurs, and the remaining switches can be turned on in the operation period in which the target data voltage is output after the initial operation period according to the output control information.

According to one more aspects of the present disclosure, the output control information can include turn-on time and turn-off time for each of the first to fourth switches.

According to one more aspects of the present disclosure, the display device can further include a source driver integrated circuit having a plurality of output buffers, and the timing controller can transmit the output control information to the source driver integrated circuit through an EPI transmission data format.

In another aspect of the present disclosure, a method of driving a display device including an amplifier for outputting a target data voltage corresponding to image data includes controlling compensation capacitance of an output node of the amplifier to decrease in an initial operation period in which transition of a data voltage output from the amplifier to the target data voltage level occurs, and controlling the compensation capacitance to increase in an operation period in which the target data voltage is output after the initial operation period.

According to one more aspects of the present disclosure, the amplifier can include a pull-up transistor for sourcing a rising current from a high voltage source to the output node and a pull-down transistor for sinking a falling current from the output node to a low voltage source, and further includes a plurality of capacitors connected in parallel between the output node and a common node of a gate electrode of the pull-up transistor and a gate electrode of the pull-down transistor, and a compensation capacitance adjuster having a switch unit including switches connected between the common node and one end of the plurality of capacitors and configured to selectively switch the plurality of capacitors according to the output control information.

According to one more aspects of the present disclosure, the controlling the compensation capacitance to decrease can include controlling the switch unit such that only one of the plurality of capacitors is connected to the common node.

According to one more aspects of the present disclosure, the controlling the compensation capacitance to increase can include controlling the switch unit such that the plurality of capacitors is connected to the common node.

It is to be understood that both the foregoing general description and the following detailed description of the present disclosure are exemplary and explanatory and are intended to provide further explanation of the present disclosure as claimed.

BRIEF DESCRIPTION OF THE DRAWINGS

The accompanying drawings, which are included to provide a further understanding of the present disclosure and are incorporated in and constitute a part of this application, illustrate aspect(s) of the present disclosure and together with the description serve to explain the principle of the present disclosure. In the drawings.

DETAILED DESCRIPTION OF THE EMBODIMENTS

Figure 1:
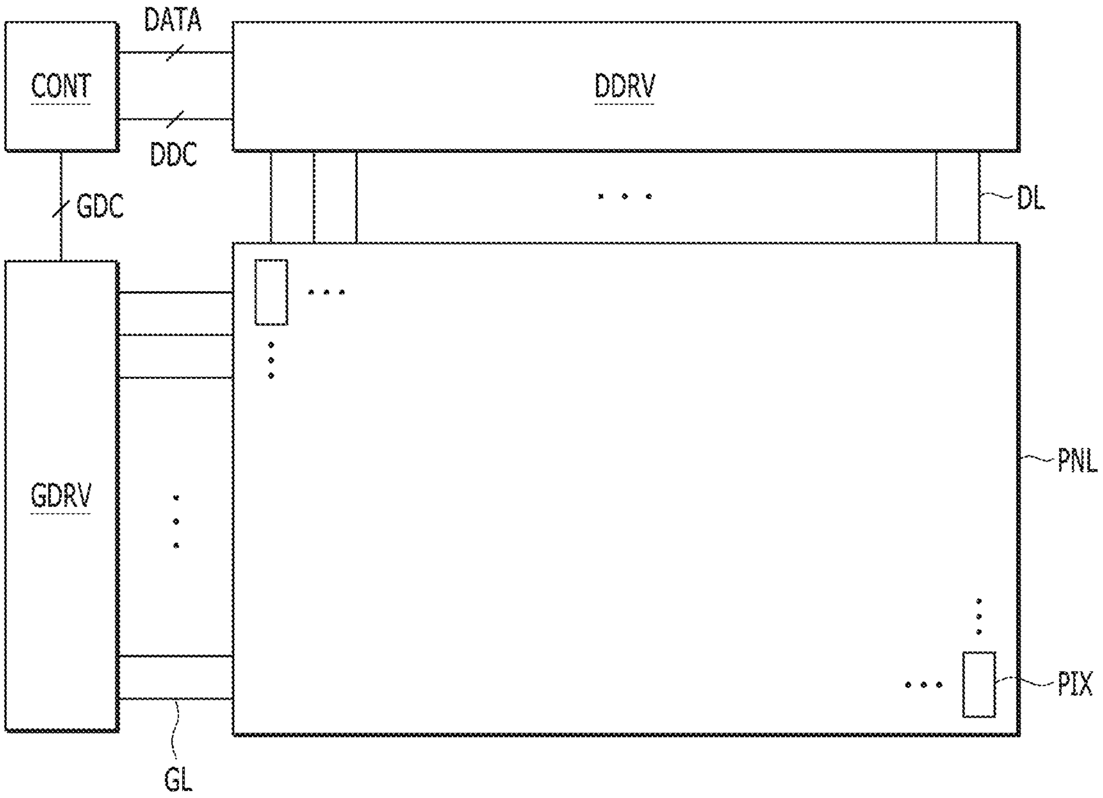
FIG. 1 is a diagram showing a display device according to an aspect of the present disclosure.

The advantages and features of the present disclosure and the way of attaining the same will become apparent with reference to embodiments described below in detail in conjunction with the accompanying drawings. The present disclosure, however, is not limited to the embodiments disclosed hereinafter and can be embodied in many different forms. Rather, these exemplary embodiments are provided so that this disclosure will be through and complete and will fully convey the scope to those skilled in the art.

The shapes, sizes, ratios, angles, numbers, and the like, which are illustrated in the drawings in order to describe various embodiments of the present disclosure, are merely given by way of example, and therefore, the present disclosure is not limited to the illustrations in the drawings. In the present disclosure, when the terms “comprise”, “include”, and the like are used, other elements can be added unless the term “only” is used. The singular forms are intended to include the plural forms as well, unless the context clearly indicates otherwise.

In interpretation of a component, the component is interpreted as including an error range unless otherwise explicitly described.

When describing positional relationships, for example, when the positional relationship between two parts is described using “on”, “above”, “below”, “beside”, or the like, one or more other parts can be located between the two parts unless the term “directly” or “closely” is used.

In the description of the various embodiments of the present invention, although terms such as, for example, “first” and “second” can be used to describe various elements, these terms are merely used to distinguish the same or similar elements from each other, and may not define order or sequence. Therefore, in the present specification, an element modified by “first” can be the same as an element modified by “second” within the technical scope of the present invention unless otherwise mentioned.

Throughout the present disclosure, the same reference numerals designate the same constituent elements. Hereinafter, embodiments of the present disclosure will be described in detail with reference to the attached drawings. In the following description, if a detailed description of known techniques associated with the present disclosure would unnecessarily obscure the gist of the present disclosure, detailed description thereof will be omitted.

Features of various embodiments of the present disclosure can be partially or entirely coupled to or combined with each other and can be operated, linked, or driven together in various ways. Embodiments of the present disclosure can be carried out independently from each other, or can be carried out together in co-dependent or related relationship.

Further, the term “can” encompasses all the meanings and coverages of the term “may.” The term “disclosure” is interchangeably used with, or encompasses all the meanings and coverages of, the term "invention."

In addition, all the components of each display device or apparatus according to all embodiments of the present disclosure are operatively coupled and configured.

Figure 2:
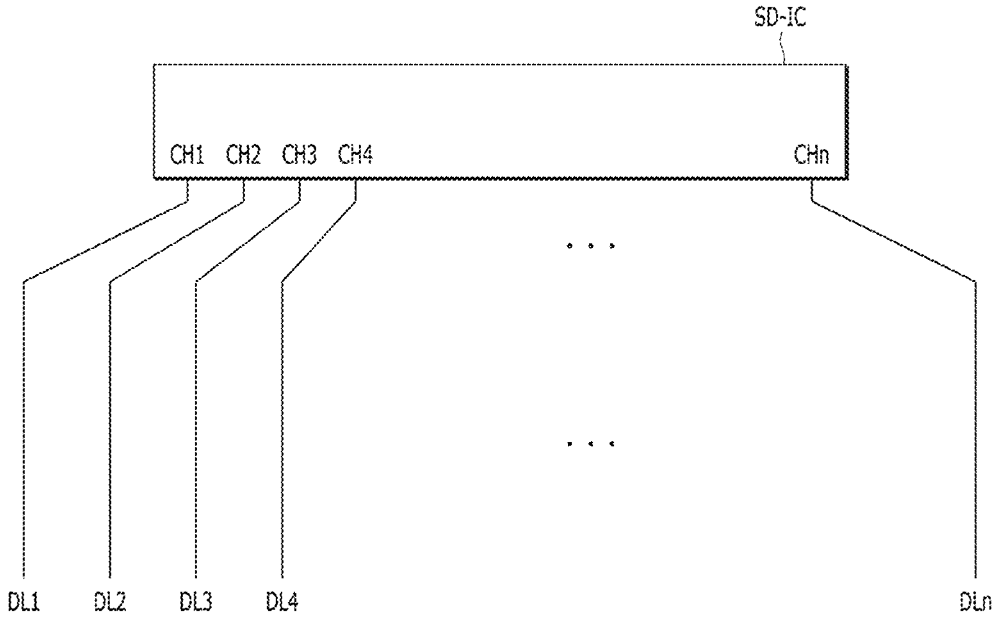
FIG. 2 is a diagram showing a connection relationship between a source driver integrated circuit and data lines in the display device according to an aspect of the present disclosure.

FIG. 1 is a diagram showing a display device according to an aspect of the present disclosure and FIG. 2 is a diagram showing a connection relationship between a source driver integrated circuit and data lines in the display device according to an aspect of the present disclosure.

Referring to FIGS. 1 and 2, the display device according to an aspect of the present disclosure can be implemented as an electroluminescent display device or a liquid crystal display device including a display panel PNL, a timing controller CONT, a data driving circuit DDRV, and a gate driving circuit GDRV.

The display panel PNL is provided with a plurality of data lines DL and a plurality of gate lines GL, and pixels PIX can be disposed at intersections of the signal lines GL and DL. A pixel array can be formed in a display area of the display panel PNL by the pixels PIX disposed in a matrix form.

In the pixel array, the pixels PIX are adjacent to each other in the horizontal direction to form horizontal lines. The number of horizontal lines corresponds to the vertical resolution of the display panel PNL. Pixels PIX constituting the same horizontal line are connected to the same gate line GL and are connected to different data lines DL. Each pixel PIX can be implemented as a light emitting cell including a light emitting diode or as a liquid crystal cell including a liquid crystal layer.

The timing controller CONT can generate a data timing control signal DDC for controlling an operation timing of the data driving circuit DDRV and a gate timing control signal GDC for controlling an operation timing of the gate driving circuit GDRV on the basis of timing signals such as a vertical synchronization signal Vsync, a horizontal synchronization signal Hsync, and a data enable signal DE input from a host system. The gate timing control signal GDC can include a gate start signal, gate shift clocks, etc. The data timing control signal DDC includes source start pulses, source sampling clocks, a source output enable signal, etc.

The timing controller CONT transmits image data DATA input from the host system to the data driving circuit DDRV through an internal interface circuit. The image data DATA is for image display on the pixels PIX, and is converted to a data voltage in the data driving circuit DDRV and then written to the pixels PIX. The internal interface circuit can be an embedded panel interface (EPI) circuit.

The timing controller CONT can generate output control information for capacitance control of a data voltage output circuit according to a driving cycle of the data driving circuit DDRV. The timing controller CONT can configure the data timing control signal DDC, the output control information, and the image data DATA into an EPI packet, which is EPI transmission format data, and then transmit the EPI packet to the data driving circuit DDRV.

The gate driving circuit GDRV generates a scan signal SCAN on the basis of the gate timing control signal GDC from the timing controller CONT and supplies the scan signal SCAN to the gate lines GL. A horizontal line on which a data voltage will be written is selected by the scan signal SCAN. The gate driving circuit GDRV can be built into a non-display area of the display panel PNL in a gate-in-panel (GIP) structure. The non-display area can be located outside a panel array in the display panel PNL.

The data driving circuit DDRV can include at least one source driver integrated circuit SD-IC. The source driver integrated circuit SD-IC separates the data timing control signal DDC, the output control information, and the image data DATA from the EPI packet received from the timing controller CONT. The source driver integrated circuit SD-IC can output analog data voltages to data lines DL1 to DLn respectively connected to output channels CH1 to CHn according to a source output enable signal SOE included in the data timing control signal DDC, where n is a real number. The source driver integrated circuit SD-IC converts the image data DATA into data voltages on the basis of the data timing control signal DDC, and then supplies the data voltages to the data lines DL1 to DLn connected to the output channel CH1 to CHn. At this time, the source driver integrated circuit SD-IC can improve both phase characteristics and margin data charging/discharging characteristics by controlling compensation capacitance set in each of the output channels CH1 to CHn according to the output control information.

Figure 3:
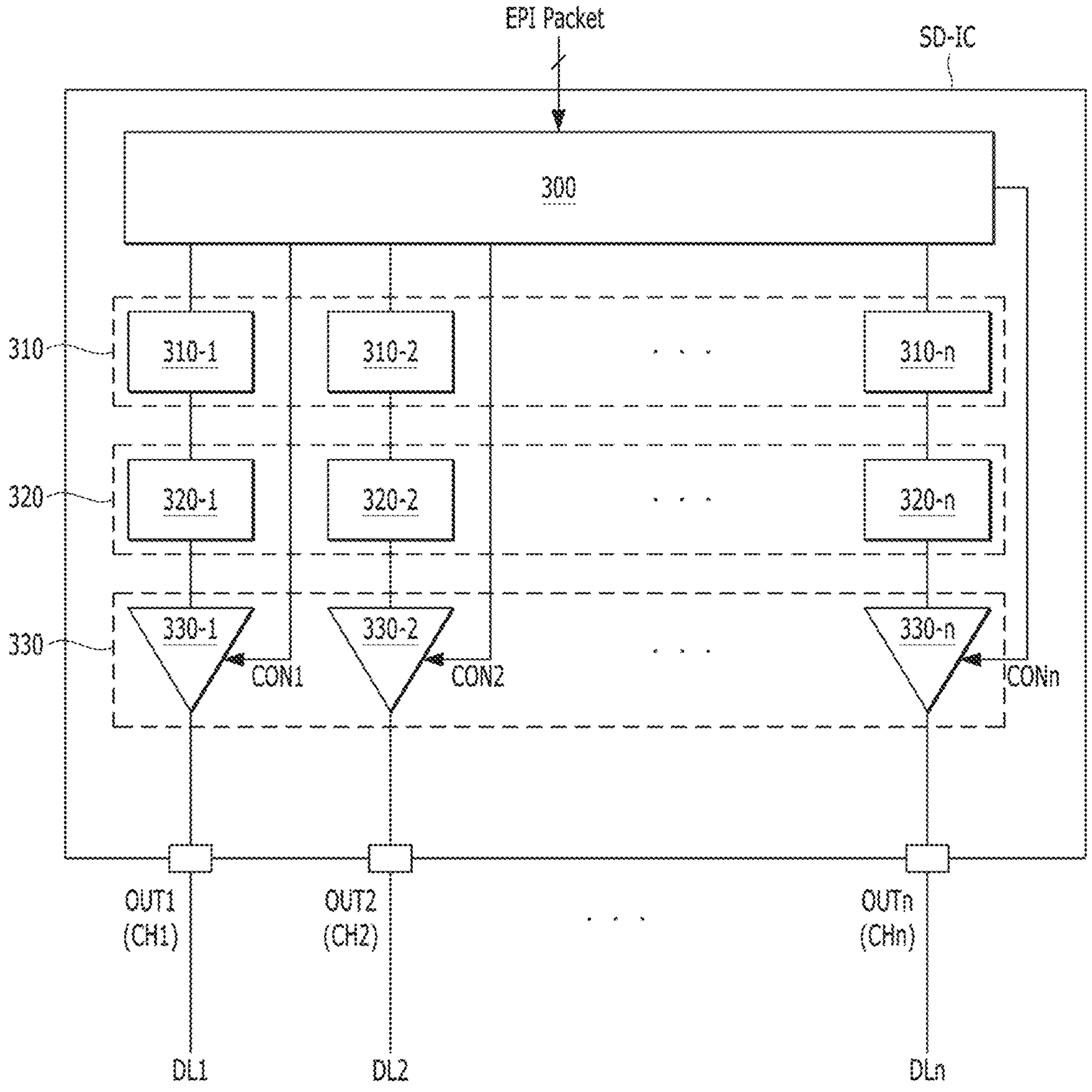
FIG. 3 is a diagram showing the source driver integrated circuit of the display device according to an aspect of the present disclosure.

FIG. 3 is a diagram showing the source driver integrated circuit SD-IC in the display device according to an aspect of the present disclosure.

Referring to FIG. 3, the source driver integrated circuit SD-IC can include a control logic circuit 300, a latch circuit 310, a D/A (digital-to-analog) conversion circuit 320, and a buffer circuit 330.

The control logic circuit 300 samples bits of control data from signals received through EPI packets according to internal clock timing and restores the data timing control signal DDC (refer to FIG. 1) for controlling the operation of the source driver integrated circuit SD-IC from the sampled control data.

The control logic circuit 300 samples image data from signals received through serial EPI packets according to the internal clock timing.

The e control logic circuit 300 samples and restores output control information CON1 to CONn from the signals received through EPI packets according to the internal clock timing. The output control information CON1 to CONn can be independently set and restored for the output channels CH1 to CHn of the buffer circuit 330.

The output control information CON1 to CONn can include information for controlling a data voltage output timing of the buffer circuit 330 and information for controlling compensation capacitance. The output control information CON1 to CONn can include switching timing control information for selectively connecting or disconnecting two or more compensation capacitors included in the buffer circuit 300 in order to adjust the compensation capacitance of the buffer circuit 330 according to the operation period in which data voltages are output. For example, the output control information CON1 to CONn can include switching timing control information for controlling on time and off time of switches respectively connected to the plurality of compensation capacitors included in the buffer circuit 330.

When a switch is turned on, the compensation capacitance increases according to the compensation capacitor connected to the switch. Accordingly, the phase margin characteristics of the buffer circuit 330 are improved, and thus oscillation occurring in the data voltages output from the buffer circuit 330 can be reduced. As the number of connected compensation capacitors increases, or as compensation capacitors with high capacitances are connected, the compensation capacitance increases.

When the switch is turned off, the compensation capacitor connected to the switch is disconnected, reducing the compensation capacitance. Accordingly, charging and discharging characteristics of the buffer circuit 330 are improved, and thus the data voltages output from the buffer circuit 330 are controlled to have a fast slewing time or fast settling time. As the number of connected compensation capacitors decreases, or as compensation capacitors with low capacitances are connected, the compensation capacitance decreases.

The output control information CON1 to CONn can be set to reduce the compensation capacitance during the initial operation of the buffer circuit 330 and increase the compensation capacitance after the initial operation. As the compensation capacitance decreases during the initial operation, the buffer circuit 330 can have a fast slewing time or a fast settling time. After the initial operation, as the compensation capacitance increases, the buffer circuit 330 can secure a phase margin to prevent oscillation from occurring in output data voltages.

The latch circuit 310 converts bits of image data sampled in the control logic circuit 300 into parallel data. The latch circuit 310 is synchronized according to an internal clock signal output from the control logic circuit 300.

The D/A conversion circuit 320 generates data voltages by converting image data converted into the parallel data into gamma compensation voltages.

The buffer circuit 330 includes a plurality of output buffers 330-1 to **330-*n*. The plurality of output buffers 330-1 to 330-*n* outputs target data voltages corresponding to the image data to the data output channels CH1 to CHn. The compensation capacitance of each of the output buffers 330-1 to 330-*n* can be controlled according to the output control information CON1 to CONn individually input from the control logic circuit 300**.

Figure 4:
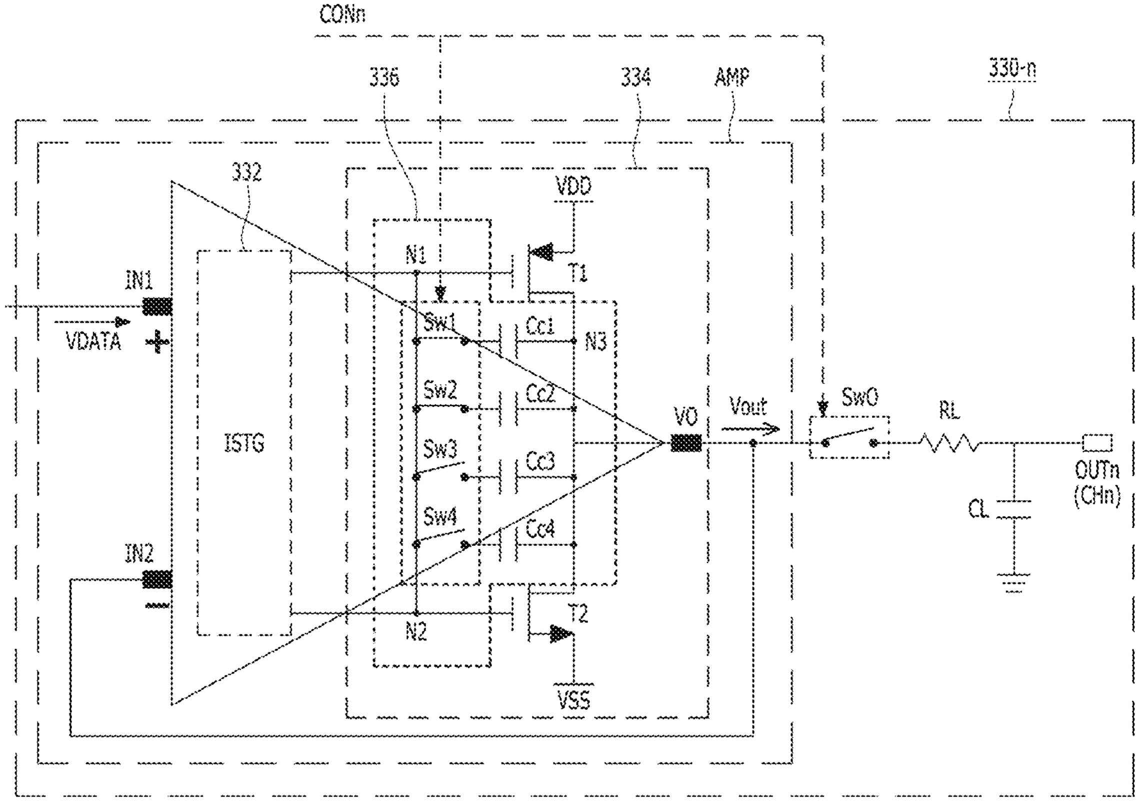
FIG. 4 is a diagram schematically showing an output circuit included in a source driver integrated circuit of a display device according to a first aspect of the present disclosure.

FIG. 4 is a diagram showing a part of the buffer circuit 330 of the display device according to a first aspect of the present disclosure. The buffer circuit 330 includes output buffers 330-1 to **330-*n*. FIG. 4 shows one of the output buffers 330-1 to 330-*n*** as an example.

Referring to FIG. 4, the output buffer **330-*n*** can include an amplifier AMP that applies a data voltage Vout to an output node VO connected to the output channel CHn, a switch SwO that controls connection between the output node VO and the output channel CHn, a resistor RL, and a capacitor CL for stabilizing a signal line between the output node VO and the output channel CHn.

The amplifier AMP generates the data voltage Vout based on a first input voltage applied to a first input terminal IN1 and a second input voltage applied to a second input terminal IN2. The amplifier AMP applies the data voltage Vout to the output node VO connected to the output channel CHn. For example, the amplifier AMP can apply the data voltage Vout generated using an image data voltage VDATA input to the first input terminal IN1 and an output voltage fed back to the second input terminal IN2 to the output node VO. The first input terminal IN1 can be a non-inverting input terminal and the second input terminal IN2 can be an inverting input terminal, but the aspect is not limited thereto.

The output switch SwO is turned on according to output control information CON to connect the output node VO of the amplifier AMP and the output channel CHn. Accordingly, the data voltage Vout output from the amplifier AMP can be supplied to the data line DLn through the output channel CHn. The amplifier AMP can include an input circuit 332 and an output circuit 334.

The input circuit 332 generates a bias signal based on the first input voltage applied to the first input terminal IN1 and the second input voltage applied to the second input terminal IN2. The input circuit 332 can be implemented as a single-ended differential amplifier, but the aspect is not limited thereto.

The output circuit 334 can generate a rising voltage or a falling voltage as the data voltage Vout in response to the bias signal applied from the input circuit 332 and apply the data voltage Vout to an output terminal VO.

The output circuit 334 includes a pull-up transistor T1 for sourcing a rising current from a first driving voltage VDD to the output terminal VO, a pull-down transistor T2 for sinking a falling current to a second driving voltage VSS from the output node VO, and a compensation capacitance adjuster 336 for controlling compensation capacitance of the output node VO.

The pull-up transistor T1 is turned on for upward transition of the data voltage Vout by receiving the bias signal applied from the input circuit 332 through the gate electrode to source the rising current to the output node VO.

The pull-down transistor T2 is turned on for downward transition of the data voltage Vout by receiving the bias signal applied from the input circuit 332 through the gate electrode to sink the falling current to the second driving voltage VSS.

The compensation capacitance adjuster 336 can include a plurality of capacitors Cc1, Cc2, Cc3, Cc3, and Cc4 connected in parallel between a common node of the gate electrode of the pull-up transistor T1 and the gate electrode of the pull-down transistor T2 and the output node, and a plurality of switches Sw1, Sw2, Sw3, and Sw4 that are connected between the common node and one end of the plurality of capacitors Cc1, Cc2, Cc3, and Cc4 and selectively switch the plurality of capacitors Cc1, Cc2, Cc3 and Cc4 according to the output control information CON.

The magnitudes and number of capacitances of the compensation capacitors Cc1, Cc2, Cc3, and Cc4 can vary depending on the design method. In the first aspect of the present disclosure, a case where the first to fourth compensation capacitors Cc1, Cc2, Cc3, and Cc4 have the same capacitance will be described.

Each of the compensation capacitors Cc1, Cc2, Cc3, and Cc4 has a first electrode connected to a connection line (that is, common node) of a first node N1 to which the gate electrode of the pull-up transistor T1 is connected and a second node N2 to which the gate electrode of the pull-down transistor T2 is connected, and a second electrode connected to the output node VO. Accordingly, the compensation capacitors Cc1, Cc2, Cc3, and Cc4 can stabilize a voltage between the gates of the pull-up transistor T1 and the pull-down transistor T2 and the output node VO. That is, by connecting the compensation capacitors Cc1, Cc2, Cc3, and Cc4, the voltage Vgs between the gate and source of the pull-up transistor T1 is stabilized, and thus the rising voltage applied to the output node VO can be stabilized. In addition, the compensation capacitors Cc1, Cc2, Cc3, and Cc4 stabilize a voltage Vgd between the second node N2 to which the gate electrode of the pull-down transistor T2 is connected and a third node N3 to which the drain electrode of the pull-down transistor T2 is connected, and thus the falling voltage applied to the output node VO can be stabilized.

The first electrodes of the compensation capacitors Cc1, Cc2, Cc3, and Cc4 are connected to the output node VO and the second electrodes thereof are connected to the switches Sw1, Sw2, Sw3, and Sw4.

The first electrode of the first compensation capacitor Cc1 is connected to the output node VO and the second electrode thereof is connected to the first switch Sw1. The first switch Sw1 can connect the second electrode of the first compensation capacitor Cc1 to the connection line (i.e., common node) between the first node N1 and the second node N2.

The first electrode of the second compensation capacitor Cc2 is connected to the output node VO, and the second electrode thereof is connected to the second switch Sw2. The second switch Sw2 can connect the second electrode of the second compensation capacitor Cc2 to the connection line (i.e., common node) between the first node N1 and the second node N2.

The first electrode of the third compensation capacitor Cc3 is connected to the output node VO, and the second electrode thereof is connected to the third switch Sw3. The third switch Sw3 can connect the second electrode of the third compensation capacitor Cc3 to the connection line (i.e., common node) between the first node N1 and the second node N2.

The first electrode of the fourth compensation capacitor Cc4 is connected to the output node VO, and the second electrode thereof is connected to the fourth switch Sw4. The fourth switch Sw4 can connect the second electrode of the fourth compensation capacitor Cc4 to the connection line (i.e., common node) between the first node N1 and the second node N2.

The switches Sw1, Sw2, Sw3, and Sw4 can be turned on according to the output control information CON to connect the compensation capacitors Cc1, Cc2, Cc3, and Cc4 corresponding thereto to the common node. Accordingly, the compensation capacitors Cc1, Cc2, Cc3, and Cc4 are connected in parallel, and the compensation capacitance can increase as the number of connected compensation capacitors increases.

Figure 5:
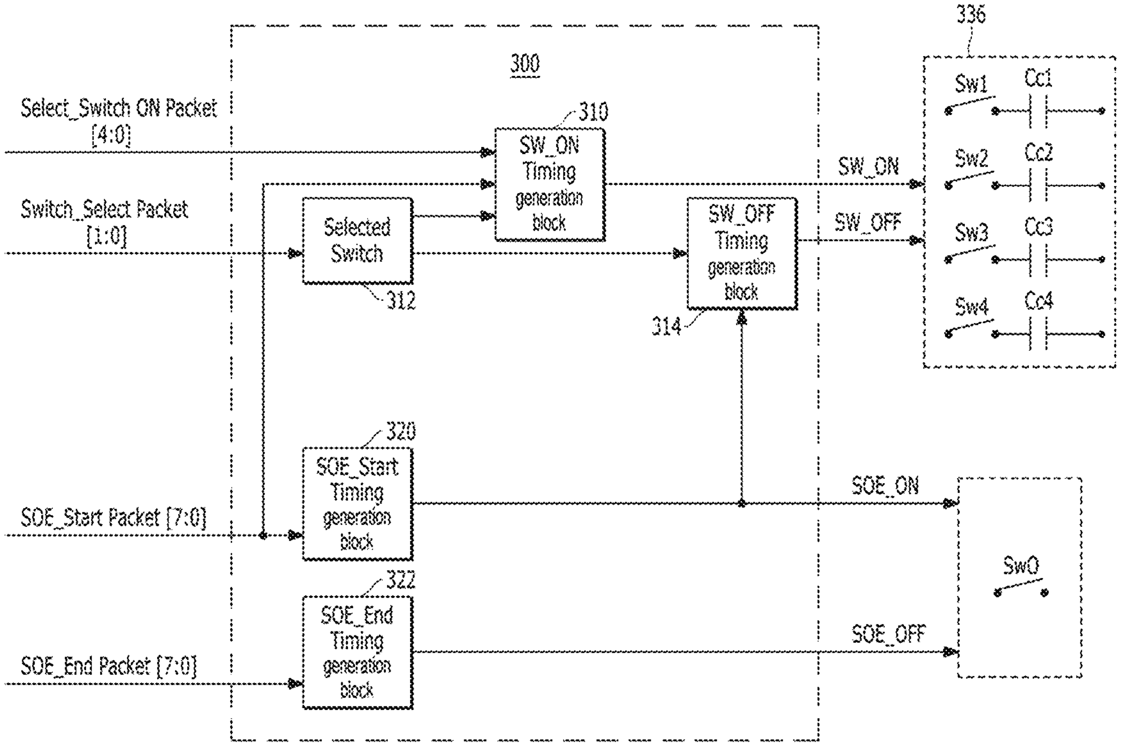
FIG. 5 is a diagram showing blocks for generating output control information for controlling switches included in the output circuit shown in FIG. 4.

FIG. 5 is a diagram showing blocks for generating output control information (Con) for controlling the switches included in the output buffer shown in FIG. 4. The output control information Con can be any one of the output control information CON1 to CONn applied to the output buffers 330-1 to 330-*n*. The output control information Con can include information for controlling a data voltage output timing of the output buffer 330*n* and information for controlling the compensation capacitance.

Referring to FIG. 5, the control logic circuit 300 can include a switch-on timing generation block 310, a switch selection block 312, a switch-off timing generation block 314, an output start timing generation block 320, and an output end timing generation block 322.

The control logic circuit 300 can extract an on-switch selection packet Select_Switch ON Packet, a switch selection packet Select_Switch Packet, an output start packet SOE_Start Packet, and an output end packet SOE_End Packet from EPI packets.

The output start timing generation block 320 outputs a turn-on signal SOE_ON to the output switch SwO provided on the output line of the amplifier output circuit according to the output start packet SOE_Start Packet. As the output switch SwO is turned on, an output voltage can be applied to each data line through the output channel.

The output end timing generation block 322 outputs a turn-off signal SOE_OFF to the output switch SwO according to the output end packet SOE_End Packet. As the output switch SwO is turned off, the data voltage Vout applied to each data line through the output channel can be blocked.

The switch selection block 312 can process the switch selection packet Select_Switch Packet, provide switch selection information to the switch-on timing generation block 310, and also provide the switch selection information to the switch-off timing generation block 314.

The switch-on timing generation block 310 can generate a switch-on timing on the basis of the on-switch selection packet Select_Switch ON Packet, the output start packet SOE_Start Packet, and the switch selection information provided by the switch selection block 312, and accordingly output a switch-on signal SW_ON to the switches Sw1, Sw2, Sw3, and Sw4 of the compensation capacitance adjuster 336. The switch-on timing generation block 310 generates the switch-on signal SW_ON with reference to the output start packet SOE_Start Packet, and thus can operate in association with the turn-on timing of the output switch SwO.

The switch-off timing generation block 314 can generate a switch-off timing on the basis of the switch selection information provided by the switch selection block 312, and accordingly output a switch-off signal SW_OFF to the switches Sw1, Sw2, Sw3, and Sw4 of the compensation capacitance adjuster 336.

With this configuration, the control logic circuit 300 can generate the switching timing control information SW_ON and SW_OFF for controlling the on/off timing of each of the switches Sw1, Sw2, Sw3, and Sw4 of the compensation capacitance adjuster 336 and the output timing control information SOE_ON and SOE_OFF for the output buffer 330-*n*.

Figure 6:
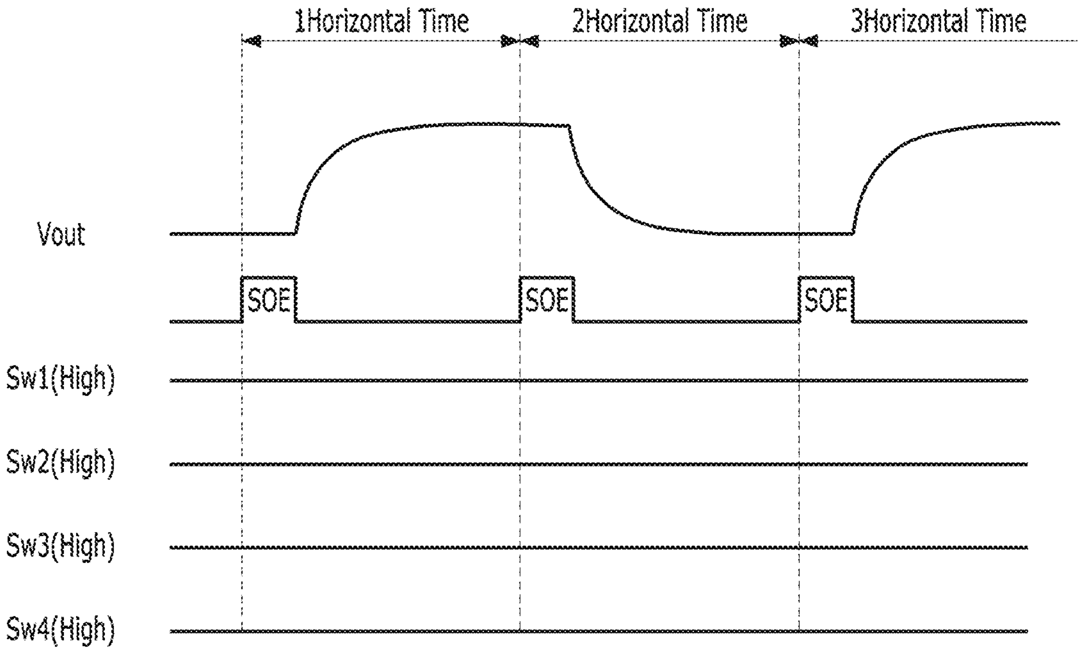
FIG. 6 is a diagram showing a relationship between switching signals and an output voltage of an amplifier according to a driving method of a comparative example.

FIG. 6 is a diagram showing a relationship between switching signals and the output voltage of the amplifier according to a driving method of a comparative example. The output circuit can output a data voltage to each of a plurality of data lines D1 to Dm at a cycle of one horizontal period 1Horizontal Time according to a source output enable signal SOE.

According to the driving method of the comparative example shown in FIG. 6, in all periods in which the amplifier operates, first to fourth switch signals SW1 to SW4 are all applied as high signals at a turn-on level. That is, the first to fourth compensation capacitors Cc1, Cc2, Cc3, and Cc4 are always connected regardless of the operation period, and thus the compensation capacitance of the output circuit of the amplifier is maintained constant.

When the signal SOE is applied in the first horizontal period 1Horizontal Time, the data voltage Vout rises to a target voltage level and is maintained at the target voltage level.

When the signal SOE is applied in the second horizontal period 2Horizontal Time, the data voltage Vout falls to the target voltage level.

Figure 7:
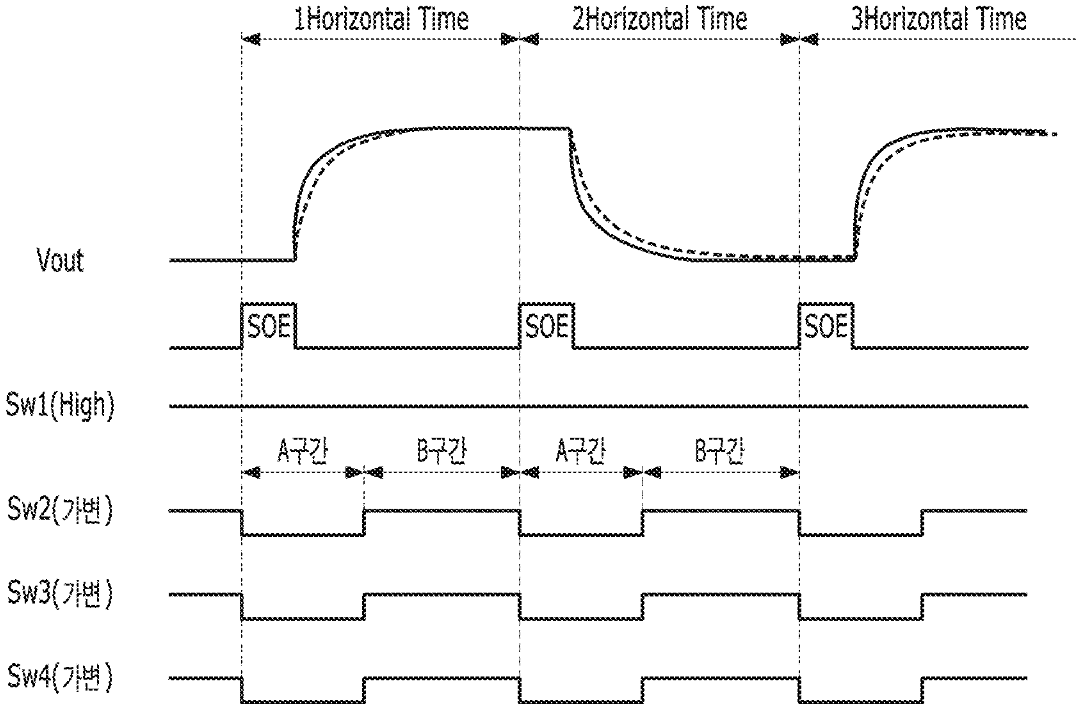
FIG. 7 is a diagram showing a relationship between a switching signal and a data voltage of an amplifier according to a driving method of the first aspect of the present disclosure.
Figure 8:
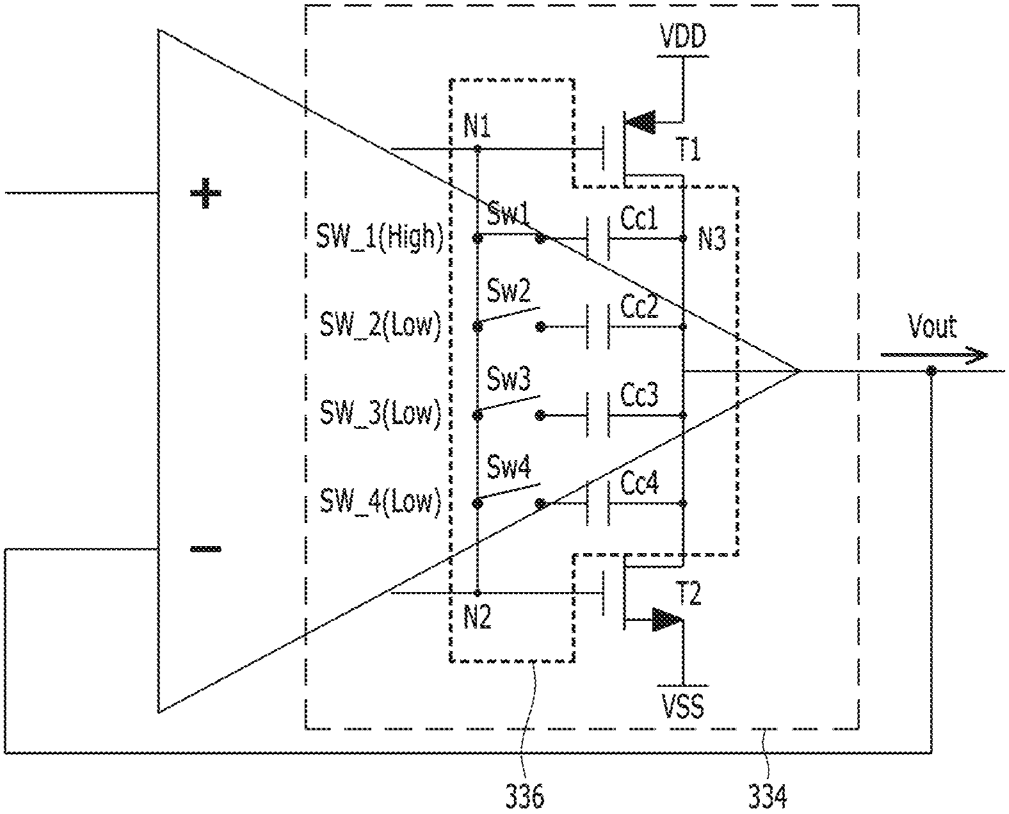
FIGS. 8 and 9 are diagrams for describing operations of switches according to the switching signal shown in FIG. 7.
Figure 9:
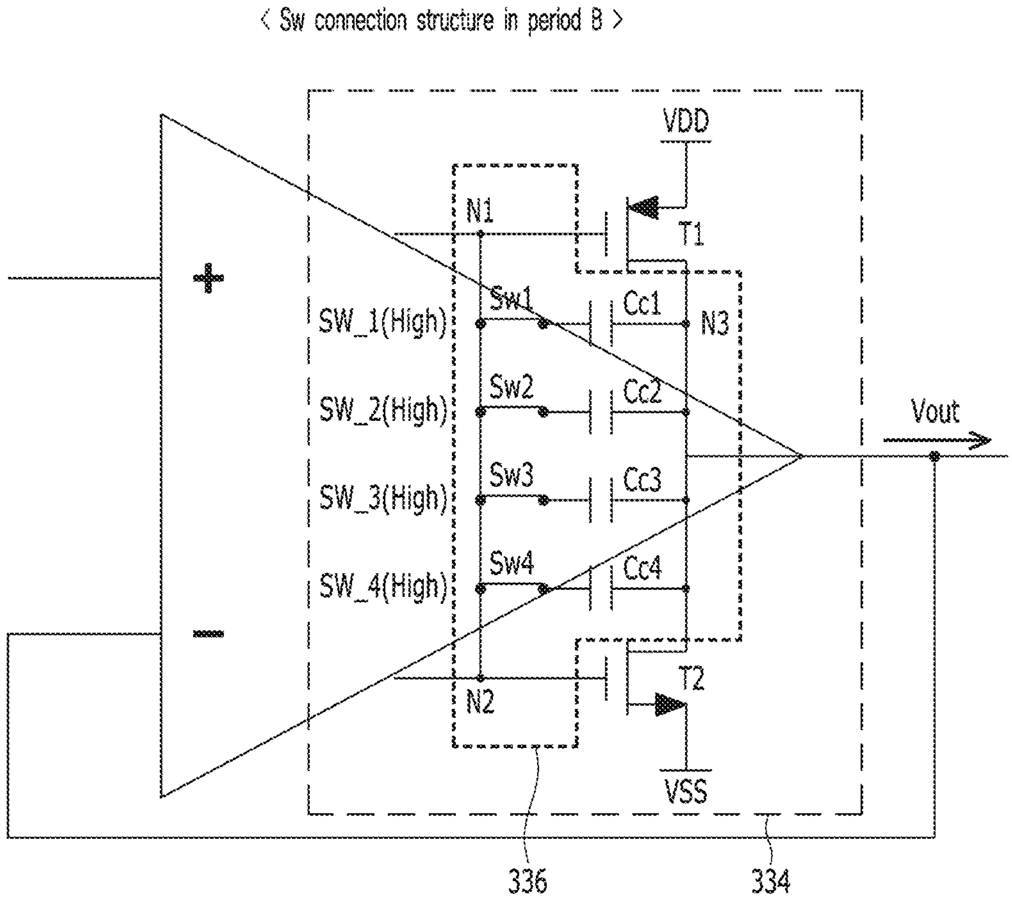
Figure 10:
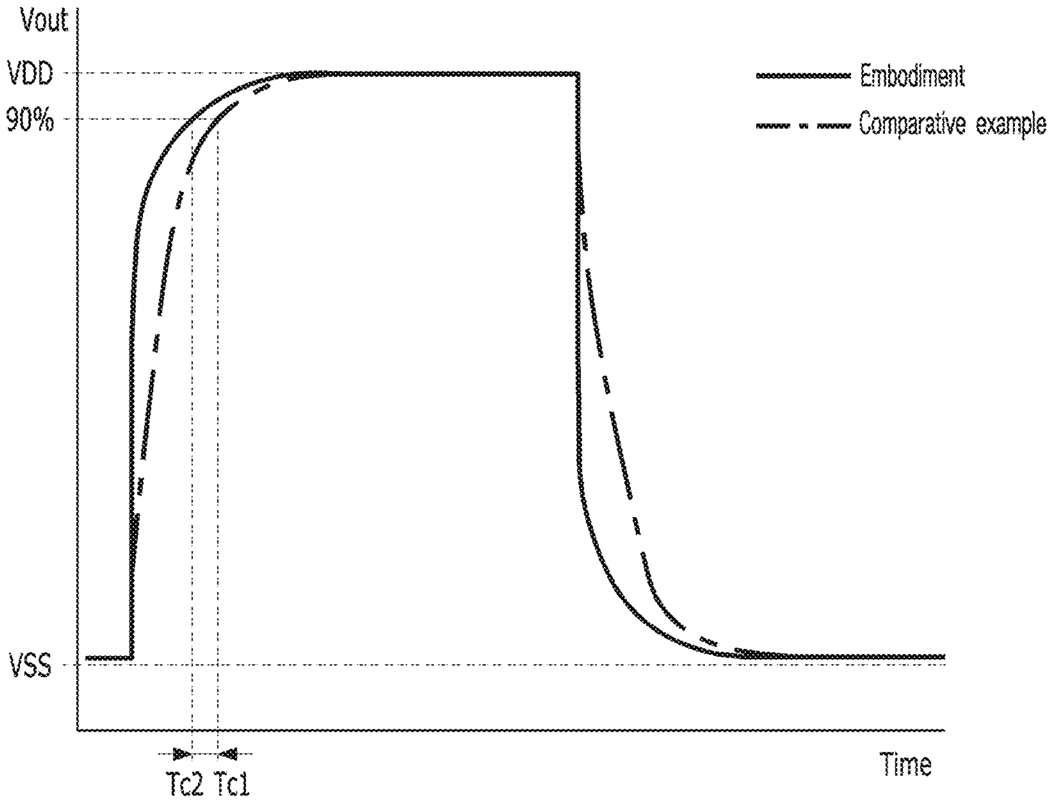
FIG. 10 is a diagram comparing data voltages according to the driving method of the comparative example and the driving method of the first aspect of the present disclosure.

FIGS. 7 to 10 are diagrams for describing a driving method of the first aspect of the present disclosure. Particularly, FIG. 7 is a diagram showing a relationship between switching signals and the data voltage Vout according to the driving method of the first aspect of the present disclosure, FIGS. 8 and 9 show the operation of the compensation capacitance adjuster 336 according to the switching signals of FIG. 7, and FIG. 10 is a diagram comparing the output voltages according to the driving method of the comparative example and the driving method of the first aspect of the present disclosure.

According to the driving method of the first aspect of the present disclosure, the compensation capacitance can be variably controlled depending on the operation period of the output circuit 334. Magnitudes and number of capacitances of the compensation capacitors Cc1, Cc2, Cc3, and Cc4 included in the compensation capacitance adjuster 336 can vary depending on the design method. In the first aspect of the present disclosure, a case where the first to fourth compensation capacitors Cc1, Cc2, Cc3, and Cc4 have the same capacitance will be described.

Referring to FIG. 7, the operation period of the output circuit 334 can be divided into period A, which is the initial operation period, and period B, which is the subsequent operation period, on the basis of one horizontal period 1Horizontal Time. The initial operation period can be set according to transition time in which the data voltage Vout rises to a target voltage level or falls from the target voltage level.

A first switch signal SW_1 can be maintained as a high signal at a turn-on level in both periods A and B.

Second to fourth switch signals SW_2 to SW_4 can be applied as a low signal at an off level in period A, and can be applied as a high signal at the turn-on level in period B.

FIG. 8 shows the operations of the switches in period A, and FIG. 9 shows the operations of the switches in period B.

Referring to FIGS. 7 and 8, in period A, the first switch Sw1 can be turned on and connected to the first compensation capacitor Cc1 as the first switch signal SW_1 is applied at the turn-on level. The second to fourth compensation capacitors Cc2 to Cc4 can be disconnected as the second to fourth switch signals SW_2 to SW_4 are applied at the turn-off level. Accordingly, since only the first compensation capacitor Cc1 is connected in period A, only the capacitance of the first compensation capacitor Cc1 can be reflected in the compensation capacitance of the output circuit of the amplifier. As the compensation capacitance decreases in period A, which is the initial operation period, the charging/discharging characteristics are improved, and thus the transition time for the data voltage Vout to change to the target voltage level can be reduced compared to the aspect, and as a result, the output slew rate of the data voltage can be improved.

Referring to FIGS. 7 and 9, in period B, the first to fourth switches Sw1 to Sw4 are turned on and connected to the first to fourth compensation capacitors Cc1 to Cc4 as the first to fourth switch signals SW_1 to SW_4 are all applied at the turn-on level.

The first to fourth compensation capacitors Cc1 to Cc4 are connected in parallel, and thus the compensation capacitance can be set to the sum of the capacitances of the first to fourth compensation capacitors Cc1 to Cc4. Accordingly, while the voltage at the target voltage level is output, the phase margin can increase to prevent oscillation of the output voltage.

FIG. 10 is a diagram comparing output voltages according to the driving method of the comparative example and the driving method of the first aspect of the present disclosure.

According to the driving method of the comparative example (FIG. 6), the first to fourth compensation capacitors Cc1 to Cc4 of the output circuit of the amplifier remain connected regardless of the operation period. On the other hand, according to the driving method of the first aspect of the present disclosure, only the first compensation capacitor Cc1 is connected in the initial operation period. Therefore, the compensation capacitance value in the initial operation period can be reduced to ¼ compared to the comparative example.

As a result, as shown in FIG. 10, a time taken for the data voltage Vout to rise to 90% of a target voltage Gamma is Tc1 in the comparative example (FIG. 6) and Tc2, which is shorter than Tc1, in the first aspect of the present disclosure, and thus it can be ascertained that the output slew rate of the data voltage is improved in the first aspect. Similarly, when the data voltage Vout falls, it can be ascertained that the data voltage Vout changes to a target voltage VSS more rapidly in the amplifier output circuit according to the first aspect of the present disclosure with smaller compensation capacitance.

On the other hand, during operation after initial operation, the first to fourth compensation capacitors Cc1 to Cc4 are all connected and the compensation capacitance is the same, and thus the same phase margin can be secured in both the comparative example and the first aspect.

As described above, according to the driving method of the first aspect of the present disclosure, switch timing can be controlled such that a small number of compensation capacitors is connected during initial operation in which output voltage transition occurs, and a large number of compensation capacitors is connected during operation. Accordingly, the compensation capacitance can be to a small value to provide a fast slewing time or fast settling time during initial operation, and the compensation capacitance can be increased to secure a phase margin and prevent oscillation of the output voltage during operation.

Figure 11:
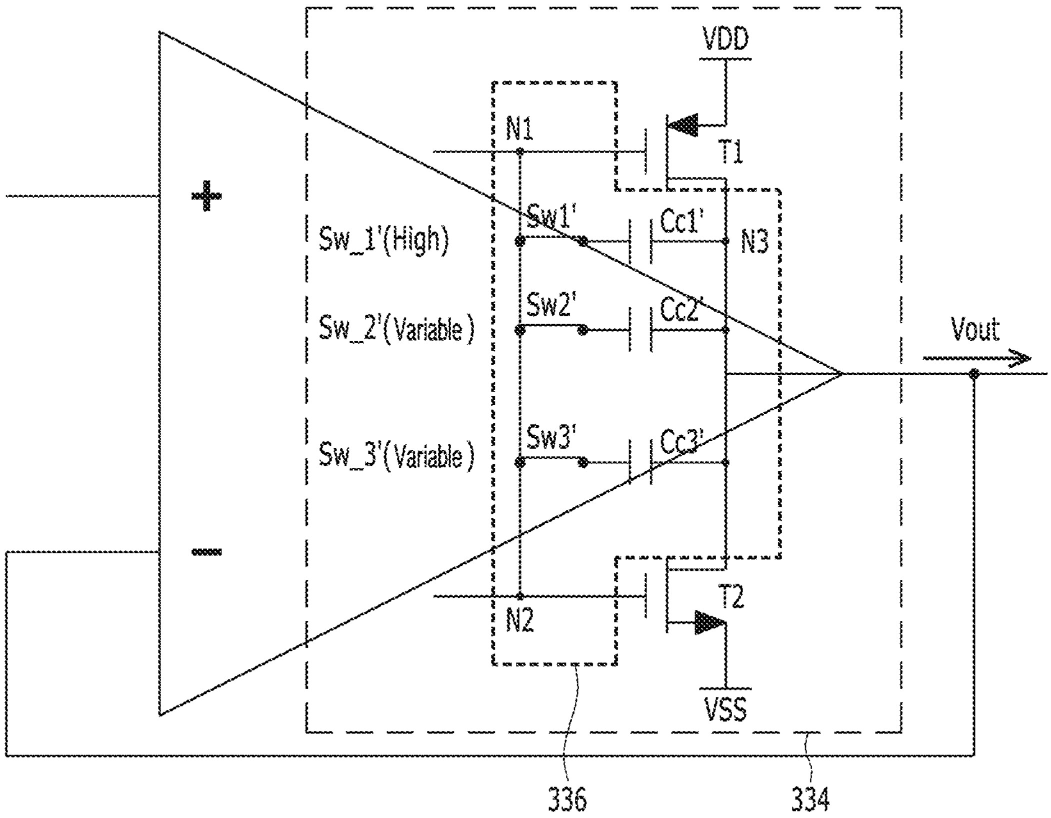
FIG. 11 is a diagram schematically showing an output circuit included in a source driver integrated circuit of a display device according to a second aspect of the present disclosure.
Figure 12:
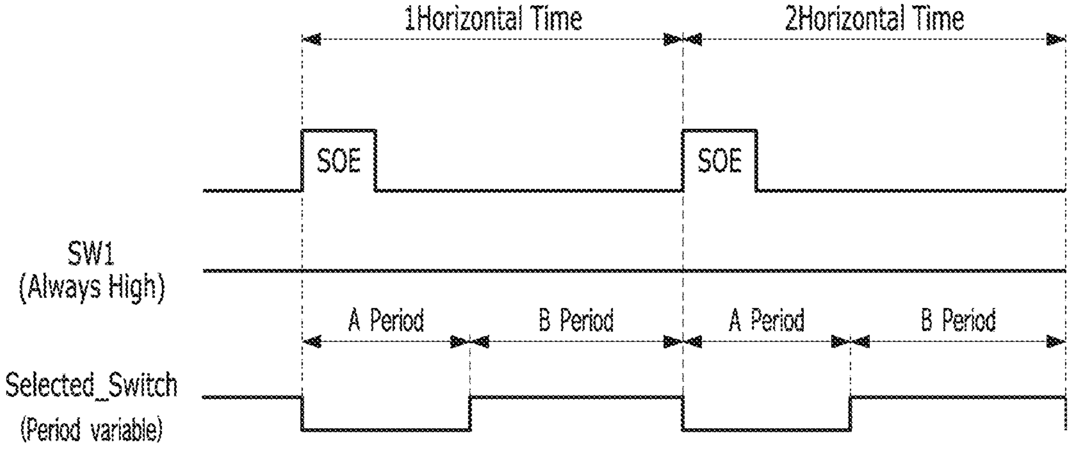
FIG. 12 is a diagram illustrating switching signals for controlling the output circuit shown in FIG. 11 according to the driving method of the second aspect.

FIG. 11 is a diagram schematically showing an output circuit included in a source driver integrated circuit of a display device according to a second aspect of the present disclosure, and FIG. 12 is a diagram illustrating switching signals according to the driving method of the second aspect of the present disclosure for controlling the output circuit.

The output circuit according to the second aspect of the present disclosure differs from the output circuit according to the first aspect shown in FIG. 4 in that compensation capacitors have different capacitances in the second aspect, and the remaining configuration is the same as that of the first aspect.

Referring to FIG. 11, a compensation capacitance adjuster 336' of the output circuit 334' according to the second aspect of the present disclosure can include first to third compensation capacitors Cc1', Cc2', and Cc3' having different capacitances. The capacitances of the first to third compensation capacitors Cc1', Cc2', and Cc3' can be designed to have a relationship of "Cc1'<Cc2'<Cc3'".

The first electrodes of the first to third compensation capacitors Cc1', Cc2', and Cc3' are connected to an output node VO, and the second electrodes thereof are connected to switches Sw1', Sw2', and Sw3'.

The first electrode of the first compensation capacitor Cc1' is connected to the output node VO, and the second electrode thereof is connected to the first switch Sw1'. The first switch Sw1' can connect the second electrode of the first compensation capacitor Cc1' to a connection line (i.e., common node) between a first node N1 and a second node N2.

The first electrode of the second compensation capacitor Cc1' is connected to the output node VO, and the second electrode thereof is connected to the second switch Sw2'. The second switch Sw2' can connect the second electrode of the second compensation capacitor Cc2' to the connection line (i.e., common node) between the first node N1 and the second node N2.

The first electrode of the third compensation capacitor Cc3' is connected to the output node VO, and the second electrode thereof is connected to the third switch Sw3'. The third switch Sw3' can connect the second electrode of the third compensation capacitor Cc3' to the connection line (i.e., common node) between the first node N1 and the second node N2.

The switches Sw1', Sw2', and Sw3' can connect the compensation capacitors Cc1', Cc2', and Cc3' corresponding thereto to the common node by being turned on according to output control information CON. Accordingly, the compensation capacitors Cc1', Cc2', and Cc3' are connected in parallel, and thus the compensation capacitance can be increased as the number of connected compensation capacitors increases.

FIG. 12 is a diagram illustrating switching signals according to the driving method of the second aspect of the present disclosure for controlling the compensation capacitance adjuster 336' shown in FIG. 11.

Referring to FIG. 12, according to the driving method of the second aspect, a first switch signal SW_1 for connecting the first compensation capacitor Cc1' having the lowest capacitance can be maintained as a high signal at a turn-on level in both period A and period B.

A switch signal for connecting the second and third compensation capacitors Cc2' and Cc3' can be applied as a low signal at a turn-off level in period A and can be applied as a high signal at the turn-on level in period B. The second and third compensation capacitors Cc2' and Cc3' have different capacitances, and the capacitance of the third compensation capacitor Cc3' is greater than that of the second compensation capacitor Cc2'. Therefore, the compensation capacitance can be adjusted by selectively connecting the second capacitor Cc2' or third compensation capacitor Cc3' or connecting both the second and third compensation capacitors Cc2' and Cc3' depending on the system.

According to this configuration, since only the first compensation capacitor Cc1' is connected in period A, only the capacitance of the first compensation capacitor Cc1' can be reflected in the compensation capacitance of the amplifier output circuit. Afterwards, in period B, the remaining compensation capacitors Cc2' and Cc3' are additionally connected to increase the compensation capacitance of the amplifier output circuit, thereby increasing the compensation margin and stabilizing the output.

Figure 13:
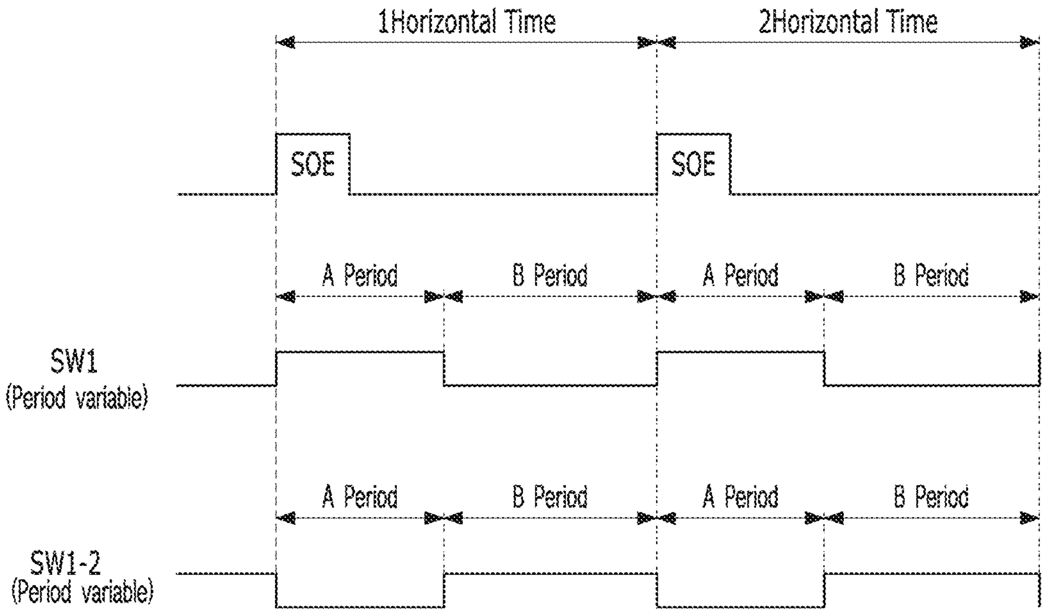
FIG. 13 is a diagram illustrating switching signals of an output circuit according to a driving method of a third aspect of the present disclosure.

FIG. 13 is a diagram illustrating switching signals of an output circuit according to a driving method of a third aspect of the present disclosure.

Referring to FIG. 13, according to the driving method of the third aspect, the first switch signal SW_1 can be maintained as a high signal at a turn-on level in period A and can be applied as a low signal at a turn-off level in period B. That is, the first switch signal SW_1 is maintained as a high signal at the turn-on level in both periods A and B in the first and second aspects, whereas the first switch signal SW_1 is applied as a signal at the turn-on level only in period A and applied as a signal at the turn-off level in period B in the third aspect.

The remaining switch signals SW_N can be applied as a low signal at the turn-off level in period A and can be applied as a high signal at the turn-on level in period B.

Which capacitor will be connected in period A and period B can be determined depending on the compensation capacitance required in the system. According to the aspects of the present disclosure, it is possible to improve data charging/discharging characteristics by minimizing the compensation capacitance in period A and improve phase margin characteristics by increasing the compensation capacitance in period B compared to that in period A.

As described above, by providing a plurality of compensation capacitors and adjusting the compensation capacitance by selectively connecting the compensation capacitors depending on the operation period, data charging/discharging characteristics can be improved by reducing the compensation capacitance during initial operation, and phase margin characteristics can be improved by increasing the compensation capacitance during operation.

The aspects of the present disclosure have the following effects and advantageous features.

According to the aspects of the present disclosure, it is possible to improve both the phase margin characteristics and data charging/discharging characteristics by adjusting the compensation capacitance of the output circuit of an amplifier depending on operation period.

According to the aspects of the present disclosure, it is possible to improve both the phase margin characteristics and data charging/discharging characteristics during operation by adjusting the compensation capacitance such that an optimal compensation capacitance is applied in an operation period in which the data charging/discharging characteristics are important and an operation period in which the phase margin characteristics are important.

According to the aspects of the present disclosure, it is possible to provide a plurality of compensation capacitors that can be selectively connected to the output circuit of an amplifier and selectively connect the compensation capacitors depending on an operation period to adjust compensation capacitance, thereby reducing the compensation capacitance during initial operation to improve the data charging/discharging characteristics and increasing the compensation capacitance during operation to improve the phase margin characteristics.

According to the aspects of the present disclosure, it is possible to improve power efficiency and reduce power consumption by adjusting the compensation capacitance of the output circuit of the amplifier to perform low-power operation.

The effects according to the present disclosure are not limited to the above-described effects, and further various effects are included in the present disclosure.

It will be apparent to those skilled in the art that various modifications and variations can be made in the present disclosure without departing from the spirit or scope of the present disclosure. Thus, it is intended that the present disclosure covers the modifications and variations of the present disclosure provided they come within the scope of the appended claims and their equivalents.

What is claimed is:

1. A display device comprising:
- a display panel including a plurality of pixels;
- a timing controller configured to generate output control information based on an output timing of image data to be written to the plurality of pixels; and
- a plurality of amplifiers configured to output a target data voltage corresponding to the image data to output channels connected to the plurality of pixels,
- wherein each of the plurality of amplifiers comprises:
  - one or more transistors configured to apply a preset rising current or a preset falling current to an output node connected to one of the channels to output the target data voltage; and
  - a compensation capacitance adjuster configured to adjust a compensation capacitance of the output node according to the output control information,
- wherein the compensation capacitance adjuster decreases the compensation capacitance of the output node of the amplifier in an initial operation period, and increases the compensation capacitance in an operation period in which the target data voltage is output after the initial operation period,
- wherein the one or more transistors comprise a pull-up transistor and a pull-down transistor, and
- wherein the compensation capacitance adjuster comprises:

a plurality of capacitors connected in parallel between the output node and a common node of a gate electrode of the pull-up transistor and a gate electrode of the pull-down transistor; and a switch unit including a plurality of switches connected between the common node and one end of the plurality of capacitors and configured to selectively switch the plurality of capacitors according to the output control information.

2. The display device of claim 1, wherein the compensation capacitance adjuster adjusts the compensation capacitance to decrease according to the output control information in the initial operation period in which a transition of a data voltage output from the amplifier to ae target data voltage level occurs.

3. The display device of claim 1, wherein the pull-up transistor sources the rising current from a high voltage source to the output node, and the pull-down transistor sinks the falling current from the output node to a low voltage source.

4. The display device of claim 1, wherein the switch unit connects only some capacitors among the plurality of capacitors to the common node in the initial operation period in which transition of a data voltage output from the output node to a target data voltage level occurs, and connects a larger number of capacitors to the common node in an operation period in which the target data voltage is output after the initial operation period.

5. The display device of claim 1, wherein the plurality of capacitors comprise first to fourth compensation capacitors, each compensation capacitor including a first electrode connected to the output node and a second electrode connected to the switch unit, and the switch unit comprises a first switch turned on according to the output control information to connect the common node and the first compensation capacitor, a second switch configured to connect the common node and the second compensation capacitor, a third switch configured to connect the common node and the third compensation capacitor, and a fourth switch configured to connect the fourth compensation capacitor interposed between the common node and the output node.

6. The display device of claim 5, wherein, in the switch unit, one of the first to fourth switches is configured to turn on in the initial operation period in which a transition of the data voltage output from the output node to a target data voltage level occurs, and the remaining switches are configured to turn on in the operation period in which the target data voltage is output after the initial operation period according to the output control information.

7. The display device of claim 5, wherein the output control information includes turn-on time and turn-off time for each of the first to fourth switches.

8. The display device of claim 1, wherein the plurality of capacitors have different capacitances from each other.

9. The display device of claim 8, wherein the plurality of capacitors comprises first to third compensation capacitors, each compensation capacitor including a first electrode connected to the output node and a second electrode connected to the switch unit, a capacitance of the first compensation capacitor is less than the capacitance of the second compensation capacitor, the capacitance of the second compensation capacitor is less than the capacitance of the third compensation capacitor, and the switch unit comprises a first switch turned on according to the output control information to connect the common node and the first compensation capacitor, a second switch configured to connect the common node and the second compensation capacitor, and a third switch configured to connect the common node and the third compensation capacitor.

10. The display device of claim 9, wherein, in the switch unit, the first switch is turned on in the initial operation period in which transition of the data voltage output from the output node to a target data voltage level occurs, and the second switch, or the third switch, or both the second and third switches are selectively turned on in the operation period in which the target data voltage is output after the initial operation period according to the output control information.

11. The display device of claim 10, wherein first switch is turned off in the operation period in which the target data voltage is output after the initial operation period according to the output control information.

12. The display device of claim 5, further comprising a source driver integrated circuit having a plurality of output buffers, wherein the timing controller transmits the output control information to the source driver integrated circuit through an EPI transmission data format.

13. A method of driving the display device of claim 1 including an amplifier among the plurality of amplifiers for outputting the target data voltage corresponding to image data, the method comprising:

controlling the compensation capacitance of the output node of the amplifier to decrease in the initial operation period in which transition of a data voltage output from the amplifier to a target data voltage level occurs; and controlling the compensation capacitance to increase in the operation period in which the target data voltage is output after the initial operation period.

14. The method of claim 13, wherein the pull-up transistor sources a rising current from a high voltage source to the output node and the pull-down transistor sinks a falling current from the output node to a low voltage source.

15. The method of claim 14, wherein the controlling the compensation capacitance to decrease comprises controlling the switch unit such that only one of the plurality of capacitors is connected to the common node.

16. The method of claim 14, wherein the controlling the compensation capacitance to increase comprises controlling the switch unit such that the plurality of capacitors is connected to the common node.

17. The method of claim 14, wherein the plurality of capacitors have different capacitances from each other, and wherein the controlling the compensation capacitance to decrease comprises controlling the switch unit such that only the capacitor with the smallest capacitance of the plurality of capacitors is connected to the common node.

18. The method of claim 17, wherein the controlling the compensation capacitance to increase comprises controlling the switch unit such that one or more of the remaining capacitors of the plurality of capacitors other than the capacitor having the smallest capacitance are selectively connected to the common node.

19. The method of claim 18, wherein the controlling the compensation capacitance to decrease further comprises disconnecting the capacitor having the smallest capacitance of the plurality of capacitors from the common node.

* * * * *